(12) United States Patent
Sunohara et al.

(10) Patent No.: US 7,605,463 B2
(45) Date of Patent: Oct. 20, 2009

(54) INTERPOSER AND METHOD FOR PRODUCING THE SAME AND ELECTRONIC DEVICE

(75) Inventors: Masahiro Sunohara, Nagano (JP); Yuichi Taguchi, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 132 days.

(21) Appl. No.: 11/505,899

(22) Filed: Aug. 18, 2006

(65) Prior Publication Data

US 2007/0108591 A1 May 17, 2007

(30) Foreign Application Priority Data

Aug. 22, 2005 (JP) ............ P.2005-239776

(51) Int. Cl.
*H01L 23/12* (2006.01)
*H01L 23/053* (2006.01)
(52) U.S. Cl. .............. 257/700; 257/698; 438/612
(58) Field of Classification Search ......... 257/700, 257/698, E23.008, E21.511; 438/612–614
See application file for complete search history.

(56) References Cited

U.S. PATENT DOCUMENTS 6,444,576 B1 * 9/2002 Kong ................ 438/667

2001/0007371 A1 * 7/2001 Kawaguchi ............. 257/698
2006/0001179 A1 * 1/2006 Fukase et al. ........... 257/778

FOREIGN PATENT DOCUMENTS

JP 2000-31345 1/2000

OTHER PUBLICATIONS

Kenji Takahashi et al. "Process Integration of 3D Chip Stack With Vertical Interconnection." *Electronic Components and Technology Conference*, 2004, pp. 601-609.

* cited by examiner

*Primary Examiner*—Theresa T Doan
(74) *Attorney, Agent, or Firm*—Drinker Biddle & Reath LLP

(57) ABSTRACT

An interposer includes a substrate made of an inorganic material; a through wiring including conductors embedded in through holes; and an upper wiring and (or)a lower wiring. The through wiring, the upper wiring and the lower wiring are respectively formed on preliminary wiring patterns that are additionally simultaneously or sequentially formed on layers made of an insulating material applied to at least wiring forming parts of the substrate, and are formed with a metal mold itself used for forming the preliminary wiring patterns or layers made of a wiring material applied by a printing operation, a plating operation or a deposition on the preliminary wiring patterns formed on the layers of the insulating material by transferring a fine structure pattern of the metal mold.

6 Claims, 6 Drawing Sheets

INTERPOSER AND METHOD FOR PRODUCING THE SAME AND ELECTRONIC DEVICE

BACKGROUND OF THE INVENTION

The present invention relates to an interposer and more particularly to an interposer (it is also referred to as an interposer board) that is interposed between a wiring board and an electronic element (for instance, a semiconductor chip) mounted on the wiring board and used to form a semiconductor device or other electronic devices. The present invention also relates to a method for producing such an interposer and a semiconductor device or other electronic devices in which the interposer is incorporated.

As well known, the semiconductor device is formed by mounting a semiconductor chip such as an IC chip or an LSI chip on a wiring board, for instance, a multi-layer circuit board. Further, to meet the miniaturization of the semiconductor device, the interposer is frequently interposed between the wiring board and the semiconductor chip. For instance, Patent Document 1 discloses a semiconductor device in which a semiconductor chip is faced down and connected to an interposer by a solder bump and a gap between the surface of the semiconductor chip and the interposer is filled with an under-fill material. The interposer has a through electrode passing through its inner part, a wiring electrode at a position corresponding to the electrode of the semiconductor chip on one surface and an external connecting terminal (an electrode pad) for connecting the wiring board to the semiconductor chip on the other surface.

Usually, in the interposer, an epoxy resin substrate is ordinarily used as its substrate, through holes are opened on the substrate, and then, the through holes are respectively filled with an electric conductive paste, or through electrodes are formed by an electrolytic plating process. However, recently, to miniaturize the semiconductor device, reduce the thickness of the semiconductor device and improve a performance thereof, a high density mounting has been demanded. For satisfying this demand, a hard and heat resistant silicon substrate has been used in place of the epoxy resin substrate. Since the silicon substrate can especially reduce its thickness and is hard, reliability during mounting or bonding the semiconductor chip can be improved. Further, since the silicon substrate is heat resistant, even when the silicon substrate is exposed to high temperature during a producing process of the semiconductor device, a warp or a deformation does not arise.

In producing the interposer made of the silicon substrate, the through holes are ordinarily formed by using a reactive ion etching method (RIE) or a laser drilling method. Further, since the through electrode or wiring can be finely processed, the use of a damascene system or a WLP (Wafer Level Package) system is proposed. In the damascene system, for instance, after a seed layer is formed in a previously formed through hole by a CVD method (a chemical gas phase growth method) or a sputtering method, the through hole is filled with copper by an electrolytic plating process. Finally, excessive copper on a surface is removed by a chemical and mechanical polishing method (CMP) (for instance, see Non-Patent Document 1). Further, in the WLP system, for instance, processes of forming a seed layer, patterning a resist, an electrolytic plating, separating the resist and removing the seed layer are sequentially carried out. However, when these systems are carried out, the processes are undesirably long and complicated and a production cost is inconveniently increased. Further, especially, since a CMP polishing machine, a CVD device and a sputtering device need to be employed, a problem arises that the cost of devices is high. Further, since the processes are complicated, a problem arises that a package is hardly miniaturized due to a multi-layer structure. [Patent Document 1] JP-A-2000-31345 (claims, FIG. 1) [Non-Patent Document 1] K. Takahashi et al., Process Integration of 3D Chip Stack with Vertical Interconnection, p. 601-609, 2004 Electronic Components and Technology Conference

SUMMARY OF THE INVENTION

It is an object of the present invention to solve the above-described problems of the usual interposer made of the silicon substrate and to provide an interposer in which producing processes are short and simple, a production can be carried out without using expensive devices such as a CMP polishing machine, a CVD device, a sputtering device or the like, and a multi-layer structure can be easily realized and a package can be serviceably miniaturized.

Further, it is another object of the present invention to provide a method in which the above-described interposer can be produced in short and simple processes by using an inexpensive and general-purpose producer in place of an expensive producer.

Further, it is still another object of the present invention to provide an electronic device provided with the interposer and satisfying requirements such as a compactness, a thin structure, a high performance and a high density mounting.

The above-described objects and other objects can be easily understood from the detailed description as mentioned below.

The inventors of the present invention eagerly studied to achieve the above-described objects, and accordingly, they found that what is called an "imprint technique" is used for patterning wiring and a printing technique is effectively used for forming the wiring and completed the present invention.

According to one aspect of the present invention, there is provided an interposer interposed between a wiring board and an electronic element mounted on the wiring board and used to form an electronic device, the interposer including: a flat plate shaped substrate made of an inorganic material; a through wiring including conductors embedded in one or more through holes passing through the substrate; and an upper wiring and/or a lower wiring that are respectively formed in predetermined patterns on the surfaces of the substrate and electrically conducted through the through wiring, wherein the through wiring, the upper wiring and the lower wiring are respectively formed on preliminary wiring patterns that are additionally simultaneously or sequentially formed on layers made of an insulating material applied for at least wiring forming parts of the substrate, and respectively parts of a metal mold used for forming the preliminary wiring patterns, or layers made of a wiring material applied by a printing operation, a plating operation or a deposition on the preliminary wiring patterns formed on the layers of the insulating material by transferring a fine structure pattern of the metal mold.

In the interposer of the present invention, the preliminary wiring pattern can be formed on the layer made of the insulating material by various techniques, however, the preliminary wiring pattern is preferably formed by a nano imprint technique. As specifically described below, the nano imprint technique is a technique that a nano metal mold having on its surface a fine indented structure pattern corresponding to a desired wiring pattern is prepared, and then, the nano metal mold is pressed to the already formed layer of the insulating material to transfer the indented structure pattern on the insulating material layer.

Further, in the interposer of the present invention, for instance, the wiring patterns such as the through wiring, the upper wiring and the lower wiring and conductor patterns such as an electrode pad and an external connecting terminal, as required, can be advantageously formed by using a film forming method such as plating, printing, deposition, etc., and more advantageously formed from a selected material by using a printing method such as a screen printing method, an ink jet printing method, or the like. As the printing method, two or more kinds of methods may be combined together as required. Further, the film forming methods such as a plating method, a printing method, a deposition method may be arbitrarily combined together.

Further, in the interposer of the present invention, various inorganic materials can be used for forming the substrate. As a preferably inorganic material, for instance, a semiconductor material such as silicon or glass may be exemplified. Silicon is especially preferable.

Still further, the interposer of the present invention may have various forms. The interposer may have a single wiring layer formed on at least one surface of the substrate, or a multi-layer structure that two or more wiring layers are laminated through insulating layers.

According to another aspect of the present invention, there is provided a method for producing an interposer interposed between a wiring board and an electronic element mounted on the wiring board and used to form an electronic device, and including a flat plate shaped substrate made of an inorganic material; a through wiring including conductors embedded in one or more through holes passing through the substrate; and an upper wiring and/or a lower wiring that are respectively formed in predetermined patterns on the surfaces of the substrate and electrically conducted through the through wiring, the method for producing the interposer including the steps of: applying an insulating material for at least wiring forming parts of the substrate; forming simultaneously or sequentially preliminary wiring patterns on layers made of the insulating material; and forming the through wiring, the upper wiring and the lower wiring on the preliminary wiring patterns and, at that time, using a metal mold for forming the preliminary wiring patterns, and employing the metal mold as the through wiring, the upper wiring and the lower wiring, or applying a wiring material on the preliminary wiring patterns formed on the layers of the insulating material by transferring a fine structure pattern of the metal mold by a printing operation, a plating operation or a deposition to form the through wiring, the upper wiring and the lower wiring.

In the method for producing an interposer according to the present invention, the preliminary wiring pattern can be formed on the layer of the insulating material by various techniques, however, as described above, the preliminary wiring pattern is preferably formed by the nano imprint technique. Further, the through wiring, the upper wiring and the lower wiring are advantageously formed from the selected material by using the printing method such as the screen printing method, the ink jet printing method or the like as described above.

According to a preferred embodiment of the present invention, there is provided a method for producing an interposer of the present invention be advantageously performed by the steps of: forming the flat plate shaped substrate made of an inorganic material; forming one or more through holes in the through wiring forming part of the substrate; filling the through holes with the insulating material; applying the insulating material on the surface of the substrate with a prescribed thickness to form the layers of the insulating material; pressing the nano metal mold having on a surface thereof the fine indented structure pattern corresponding to the wiring pattern to the layers of the insulating material to transfer the indented structure pattern to the layers of the insulating material; separating the nano metal mold from the substrate to obtain the preliminary wiring patterns formed on the layers of the insulating material; and applying the wiring material on the preliminary wiring patterns by a printing operation, a plating operation or a deposition to form the through wiring, the upper wiring and the lower wiring. Here, as the flat plate shaped substrate, a thick substrate may be prepared as required, and a back surface may be ground by a back grinding process to adjust the thickness to a prescribed thickness.

Further, according to another preferred embodiment of the present invention, there is provided a method for producing an interposer including the steps of: forming the flat plate shaped substrate made of an inorganic material; applying the insulating material on the surface of the substrate with a prescribed thickness to form a first layer of the insulating material; pressing a first nano metal mold having on a surface thereof a fine indented structure pattern corresponding to a first wiring pattern to the first layer of the insulating material to transfer the indented structure pattern to the first layer of the insulating material and form a first preliminary wiring pattern; forming one or more through holes in the through wiring forming part of the substrate; applying the insulating material on a surface opposite to the first layer of the insulating material of the substrate with a prescribed thickness; filling the through holes with the insulating material to form a second layer of the insulating material; pressing a second nano metal mold having on a surface thereof a fine indented structure pattern corresponding to a second wiring pattern to the second layer of the insulating material to transfer the indented structure pattern to the second layer of the insulating material; separating the second nano metal mold from the substrate to obtain a second preliminary wiring pattern formed on the second layer of the insulating material; and applying the wiring material on the first and second preliminary wiring patterns by a printing operation, a plating operation or a deposition to form the through wiring, the upper wiring and the lower wiring.

Here, as the flat plate shaped substrate, a thick substrate may be prepared as required, and a back surface may be ground by a back grinding process to adjust the thickness to a prescribed thickness. Further, the insulating material used for forming the second insulating material layer may be different from the insulating material used for forming the first insulating material layer as desired, however, the first and second insulating material layers are preferably formed with the same insulating material from the viewpoints of obtained insulating characteristics or a production cost.

Further, in the above-described method for producing an interposer, a series of working processes subsequent to a forming process of the substrate may be repeated as required to form a multi-layer structural body in which a plurality of wiring layers are laminated on the surface of the substrate through the insulating layers.

According to a still another aspect of the present invention, the present invention concerns an electronic device having at least one electronic element, characterized in that the electronic element is mounted on an upper part of the wiring board through the interposer according to the invention.

As can be understood from a below-described detailed explanation, according to the present invention, since the imprint technique, particularly, the nano imprint technique is introduced differently from the usual method for producing the interposer made of the silicon substrate, the interposer can be produced in short and simple producing processes. Further, in producing the interposer, since expensive devices such as the CMP polishing machine, the CVD device using a vacuum process, the sputtering device or the like do not need to be employed as in a usual case, a production cost can be greatly serviceably reduced. Further, the through wiring can be formed by a fine pattern and a dimensional error can be restricted to an extremely low level, so that a wiring density and the reliability of the device can be improved. Still further, the multi-layer structure of the interposer can be easily realized, which can contribute to the high density mounting and the miniaturization of the package.

Further, according to the present invention, the electronic device can be provided that satisfies requirements such as a compactness, a thin form, a high performance and a high density mounting or the like.

DETAILED DESCRIPTION OF THE PREFERRED EMBODIMENTS

As described above, the present invention relates to an interposer interposed between a wiring board and an electronic element mounted on the wiring board and used for forming an electronic device, a method for producing an interposer and an electronic device having the interposer of the present invention. Here, the "wiring board" is employed in a broad sense and means various kinds of mounting substrates on which electronic elements are anticipated to be mounted, for instance, a wiring board in which a wiring is already formed like a multi-layer wiring board, substrates on which a wiring is anticipated to be formed in a process of a post-stage such as a semiconductor substrate (for instance, a silicon substrate, etc.), a glass substrate, an insulating resin substrate, etc. Further, the "electronic element" means active elements, for instance, a semiconductor element (an IC chip, an LSI chip, etc.), passive elements such as a capacitor, a resistor, etc. or other electronic parts. Accordingly, the "electronic device" means a device (an electronic device) on which various kinds of electronic elements are mounted and a typical example thereof is a semiconductor device.

Now, preferred embodiments of the present invention will be described by referring to the accompanying drawings. Below-described embodiments merely show examples and it is to be understood that the present invention is not limited to these embodiments.

Figure 1:
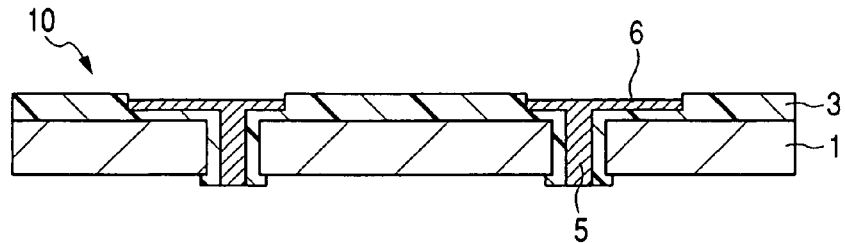
FIG. 1 is a sectional view showing one embodiment of an interposer for a semiconductor device according to the present invention.

FIG. 1 shows one example of an interposer for a semiconductor device according to the present invention. The interposer 10 shown in the drawing includes a flat plate shaped substrate 1 made of an inorganic material, through wiring 5 including conductors embedded in through holes passing through the substrate 1 and upper wiring 6 formed in predetermined patterns on the surface of the substrate 1 and electrically conducted through the through wiring 5.

Though not shown in the drawing, on the upper wiring 6, a semiconductor element such as an LSI chip can be mounted. For instance, a solder bump previously formed on the lower surface of the semiconductor element as an external terminal can be connected to an electrode pad formed on the upper wiring of the interposer 10. Further, an electrode of a wiring board can be connected to an electrode pad formed on an end face of the through wiring 5 of the interposer 10 through a solder bump. Further, a part between the wiring board and the interposer 10 and a part between the interposer 10 and the semiconductor element are ordinarily respectively filled with an insulating sealing resin (an under-fill material).

The through wiring 5 and the upper wiring 6 are not directly formed on the through holes or the upper surface of the substrate 1 and are formed on insulating material layers 3 applied to at least wiring forming parts of the substrate. Particularly, the interposer 10 of the present invention is characterized in that after preliminary wiring patterns corresponding to desired wiring patterns are formed on the insulating material layers 3 by an imprint method, a wiring material is applied to upper parts of indents of the obtained preliminary wiring patterns or the inner parts of the through holes by a printing process, a plating process or a deposition process to respectively form wiring. For forming the wiring, especially, a screen printing of a conductor paste, an ink jet printing of electric conductive ink or the like can be advantageously employed. The preliminary wiring patterns may be simultaneously formed on the insulating layers, or depending on the structure or a method of forming a desired interposer, the preliminary wiring patterns may be sequentially formed step by step. According to another method, as the through wiring 5 and the upper wiring 6, a metal mold used for the imprint method may not be removed from the substrate and may be directly used as the wiring.

Further specifically explained, in the interposer according to the present invention, the substrate forming a main body thereof is ordinarily preferably formed with an inorganic material having a heat resistance and insulating characteristics. Since the interposer for the semiconductor device is ordinarily exposed to an environment of high temperature in producing (for instance, a sputtering process) the semiconductor device, the substrate is desirably formed with the above-described inorganic material in order to prevent the generation of a warp or a deformation and to ensure an electric conduction between the wiring board and the electronic element. Though suitable materials for the substrate are not limited to materials enumerated below, for instance, a semiconductor material such as silicon, glass or the like may be exemplified. When characteristics recently required for the interposer or easiness for processing are taken into consideration, it is especially advantageous to form the substrate with silicon.

The substrate is ordinarily used in the form of a flat plate. The size of the substrate is not especially limited to a specific size and can be arbitrarily changed depending on the function or the size of the desired interposer. The thickness of the substrate is ordinarily located within a range of about 30 to 300 μm and preferably within a range of about 50 to 200 μm. To reduce the thickness of the interposer, the use of the substrate with the thickness of 50 μm or so is usually recommended. Further, assuming that a main surface of the substrate is square, the size (length of one side) of the substrate is ordinarily located within a range of about 2.0 to 30.0 mm. The substrate is easily manufactured by cutting a disk such as a silicon wafer into individual small pieces by dicing or the like. Ordinarily, the individual substrates are advantageously simultaneously cut after the substantial part of the interposer is formed on the silicon wafer. Further, the thick interposer may be initially cut out, and then, the thickness may be adjusted to a prescribed thickness by polishing a back surface by what is called a back grinding process.

In the interposer of the present invention, to form the through wiring passing through the substrate, thin holes (through holes) need to be formed in prescribed positions (one-position or two or more positions) of the substrate. The through holes can be formed by using various techniques. For instance, when the silicon substrate is used as the substrate, a plurality of through holes with a prescribed size can be formed by a YAG laser or an eximer laser or the like. After the through holes are formed, the surface of the substrate is ordinarily smoothed by polishing. Further, when the glass substrate is used, the through holes may be drilled by etching by the use of a mask or may be drilled by sandblasting by the use of a mask. Also in the case of the glass substrate, the surface is preferably smooth.

Further, the through holes may be formed to have various sizes depending on the structure of the desired interposer. The size of the through holes is ordinarily about $\phi$ 10 to 300 μm, preferably about $\phi$ 30 to 100 μm and most preferably $\phi$ 50 μm.

In the usual method, after through holes are formed, the through holes are ordinarily filled with conductor metal (for instance, copper, aluminum, etc.) by a plating method to form through wiring. However, in the present invention, as described above, the insulating material is applied to at least the wiring forming parts of the substrate to fill the through holes with the insulating material and accumulate the same insulating material on the surface of the substrate with a prescribed thickness. Here, as the insulating material, various materials may be employed and a thermoplastic resin or a ultraviolet ray curing resin, for instance, a polyimide resin may be used. Further, the insulating material layer can be formed by employing various methods. As a suitable film forming method, for instance, a spin coat method, a screen printing method or the like maybe exemplified. Further, the insulating material layer can be formed with various thickness that is ordinarily located within a range of about 5 to 50 μm and preferably within a range of about 10 to 20 μm. According to the embodiment of the present invention, the through holes are ordinarily filled with the insulating material and layers of a prescribed thickness are formed with the same insulating material on the surface of the substrate. The through holes may be filled with the insulating material at the same time as the formation of the insulating material layers, or the through holes may be filled with the insulating material independently of the formation of the insulating material layers. When the through holes are filled with the insulating material independently of the formation of the insulating material layers, imprint processes of at least two times are necessary as described below.

After the through holes are filled with the insulating material or the insulating material layers are formed on the surface of the substrate as described above, the preliminary wiring patterns are formed in the inner parts of the through holes and the upper parts of the insulating material layers correspondingly to the desired wiring patterns. The preliminary wiring patterns are preferably formed on the insulating material layers by an imprint technique, especially, a nano imprint technique according to the present invention. By using the nano imprint technique, a nano metal mold having on its surface a fine indented structure pattern corresponding to the desired wiring pattern is pressed to the insulating material layers so that the indented structure pattern can be transferred to the insulating material layers. As a material of the nano metal mold, for instance, nickel, silicon, glass, etc. may be exemplified. According to this technique, a protruding part of the nano metal mold is inserted into the inner parts of the through holes, so that after the nano metal mold is pulled out, slightly smaller second through holes useful for forming the through wiring can be formed again in the substrate. The preliminary wiring patterns may be simultaneously formed on the insulating layers. Otherwise, this technique may be modified, and the preliminary wiring patterns may be formed only on the insulating material layers in an initial stage and the through holes may be filled with the insulating material in an arbitrary post-stage.

Subsequently, the wiring material (conductor metal such as silver, copper, etc.) is applied to the upper parts of the indents of the obtained preliminary wiring patterns or the inner parts of the second through holes by a printing process, a plating process, a deposition or the like to form the through wiring, the upper wiring and the lower wiring. For forming the wiring, especially, a screen printing of a conductor paste such as silver, copper, etc. and an ink jet printing of electric conductive ink such as silver, copper, etc. or the like can be advantageously employed. Further, the second through holes may be filled with silver, copper or the like by a plating process to from the through wiring together with the upper wiring and the lower wiring. According to another method, a process for forming the through wiring, the upper wiring and the lower wiring by the above-described method may be omitted, the metal mold used for the imprint technique may not be removed from the substrate and may be directly used as the wiring. As a material of the metal mold in this case, for instance, nickel, copper or the like can be advantageously employed.

The interposer of the present invention includes the through wiring, the upper wiring and the lower wiring in its substrate and may arbitrarily include additional elements common in the field of the interposer in addition thereto. For instance, both the end faces of the through wiring, that is, wiring layers exposed on the front and back surfaces of the substrate may be formed in the shapes of electrode pads, or the formed wiring layers may be patterned to form the electrode pads. The form of the electrode pad is not especially limited to a specific figure, however, ordinarily preferably protrudes in the shape of a land. Further, the electrode pad is preferably processed to the form of a pan to easily accommodate the solder bump. Further, both the end faces of the through wiring may be formed in the shapes of the electrode pads as described above and may be directly used. However, as previously described, the solder bump or other connecting means maybe preferably further provided. The solder bump is interposed so that the interposer can be more assuredly and strongly bonded to other parts.

Further, additionally, in the interposer of the present invention, additional functional elements integrally formed on the front surface and (or) the back surface of the substrate may be provided in the shapes of thin films. Here, the functional element may be an active element such as a semiconductor element. Otherwise, the functional element may be a passive element such as a capacitor, a resistor, an inductor, etc. Further, the functional element may be a specific wiring, for instance, a re-wiring layer. These functional elements may be independently used or two or more kinds of them maybe arbitrarily combined together and employed.

Figure 2:
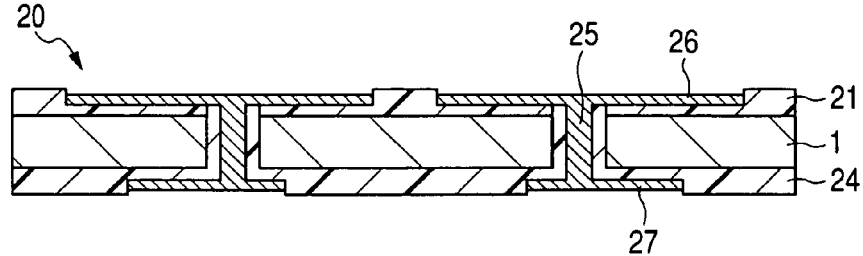
FIG. 2 is a sectional view showing another embodiment of an interposer for a semiconductor device according to the present invention.

FIG. 2 is a sectional view showing another embodiment of an interposer for a semiconductor device according to the present invention. The interposer 20 has the same structure as that of the interposer 10 shown in FIG. 1, however, the interposer 20 is different from the interposer 10 in a point that a lower insulating layer 24 is provided in addition to an upper insulating layer 21 and a lower wiring 27 is provided in addition to an upper wiring 26 connected to a through wiring. As described below, producing processes are different between the interposer 20 and the interposer 10. However, characteristics of the interposer 20 can be compared with those of the interposer 10 shown in FIG. 1.

Figure 3:
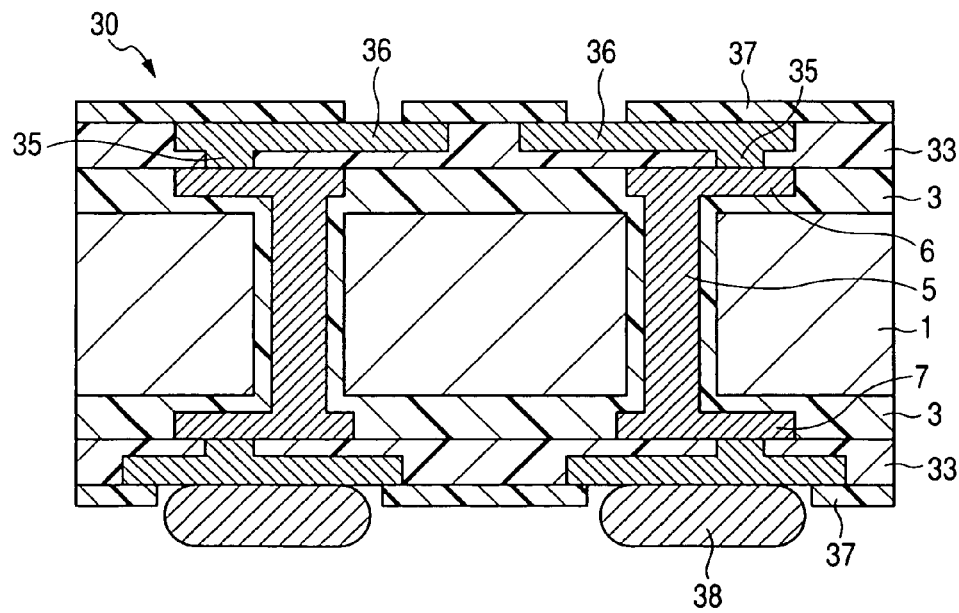
FIG. 3 is a sectional view showing a still another embodiment of an interposer for a semiconductor device according to the present invention.

FIG. 3 is a sectional view showing a still another embodiment of an interposer for a semiconductor device according to the present invention. The interposer 30 has the same structure as that of the interposer 20 shown in FIG. 2 in the periphery of a substrate 1. However, as apparent from the drawing, the interposer 30 is different from the interposer 20 in a point that the interposer 30 has a multi-layer structure in which a plurality of wiring layers are laminated through insulating layers.

Specifically described, the interposer 30 is formed with a substrate 1 (thickness of 200 μm) made of, for instance, silicon and has a through wiring 5 formed by an ink jet printing process of copper ink on its through hole (diameter of 50 μm). Further, the upper end face of the through wiring 5 is formed integrally with an upper wiring 6 and the lower end face of the through wiring 5 is formed integrally with a lower wiring 7, respectively. Further, these wiring is not directly formed on the substrate 1 and is formed through interlayer insulating resin layers 3 (a polyimide film having the thickness of 1 μm) formed by an imprint technique. In the interlayer insulating resin layer 3, the thickness of areas that do not have these wiring is 10 μm. The above-described structure is the same as that of the interposer 20 shown in FIG. 2.

In the interposer 30 shown in FIG. 3, the imprint technique is performed again in accordance with the present invention. Namely, for instance, for explaining the upper part of the substrate, an additional wiring is formed in accordance with a below-described procedure.
(1) An interlayer insulating resin layer 33 is formed that has a preliminary wiring pattern by the imprint technique.
(2) A via-hole is formed in a prescribed part of the interlayer insulating resin layer 33.
(3) A through wiring 35 and an upper wiring 36 are formed by an ink jet printing process of copper ink.
(4) A passivation film is formed by a solder resist (a polyimide film or an SiN film may be formed) and
(5) A board connecting terminal (a solder ball) is formed.

EXAMPLE

Subsequently, by referring to the attached drawings, the interposer of the present invention and a method for producing the interposer will be described below. It is to be understood that the present invention is not limited to these examples.

Example 1

In this example, the production of the interposer for the semiconductor device shown in FIG. 1 will be described by referring to FIGS. 4A to 4I.

Figure 4A:
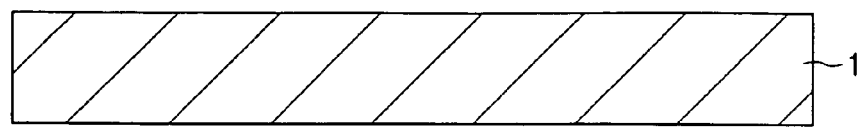
FIGS. 4A to 4I are sectional views sequentially showing a method for producing the interposer shown in FIG. 1.

Initially, as shown in FIG. 4A, a silicon wafer 1 having a prescribed size (in this example, thickness of 625 μm) is prepared.

Figure 4B:

Then, to set the thickness of the silicon wafer 1 to 200 μm, as shown in FIG. 4B, a back surface is polished. A back surface polishing process can be performed by using a back surface polishing machine sold at a market. In the drawing, a part shown by a dotted line is removed.

Figure 4C:
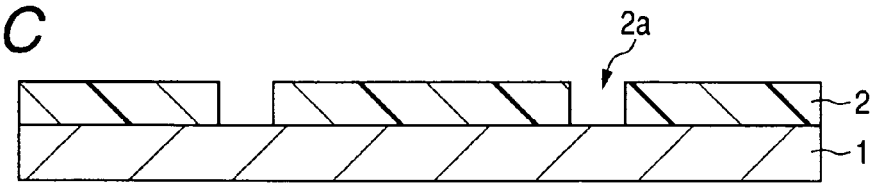

After the silicon wafer 1 having the thickness of 200 μm is manufactured, a resist excellent in its etching resistance is applied to the surface of the silicon wafer 1. After the resist is hardened, the resist is patterned. As shown in FIG. 4C, the silicon wafer 1 having a resist pattern 2 is obtained. Here, an opening 2a of the resist pattern 2 is provided to form a through wiring in a process of a post-stage. The diameter of the opening is arbitrarily changed within a range of, for instance, about 50 to 150 μm.

Figure 4D:

After the resist pattern 2 is formed, the silicon wafer 1 of a substrate is etched by using the resist pattern as a mask to form a very thin through hole 11 as shown in FIG. 4D. For an etching process, a technique generally used for etching the silicon wafer, for instance, a plasma etching, a sputter etching and a reactive ion etching (RIE) may be employed. For instance, the plasma etching can be carried out by using $CF_4$ or $SF_6$ as etching gas. Further, a wet etching process using etching liquid may be employed in place of such a dry etching process. Further, the through hole may be formed by a laser process using, for instance, a $CO_2$ laser or a YAG laser. When such a method is used, the above-described resist process can be omitted.

Figure 4E:
Figure 4F:
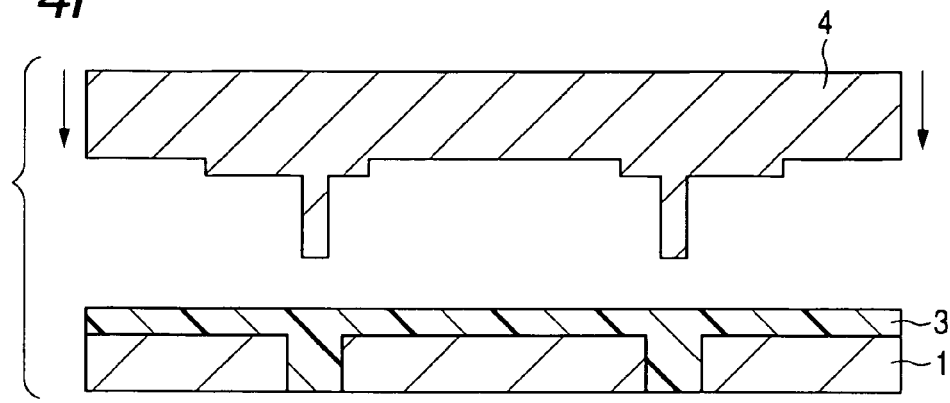

Then, to form an interlayer insulating film having a preliminary wiring pattern in a process of a post-stage, the process shifts to an imprint process. Firstly, as shown in FIG. 4E, for instance, a thermoplastic resin or a ultraviolet ray curing resin (in this example, polyimide resin) is applied to the upper surface of the silicon wafer 1 and the through hole 11 by a screen printing process to form an insulating resin layer 3.

Figure 4G:
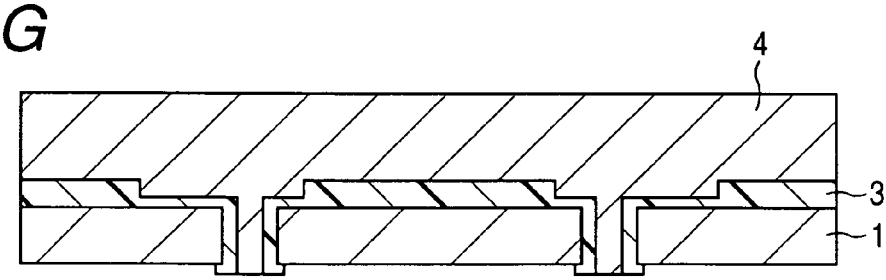

After the insulating resin layer 3 is formed as described above, as shown in FIG. 4F, a nano metal mold 4 having on its surface a fine indented structure pattern corresponding to a desired wiring pattern that is separately prepared is pressed to the insulating resin layer 3. The nano metal mold 4 is manufactured by finely processing, for instance, nickel, silicon, glass or the like. Here, since it is important to position the nano metal mold 4 on the silicon wafer 1, for instance, a vertical camera (not shown in the drawing) is employed to carry out an alignment with special care. Further subsequently, as shown in FIG. 4G, the nano metal mold 4 is forced into the insulating resin layer 3 of the silicon wafer 1, and under this state, the insulating resin is hardened.

Figure 4H:
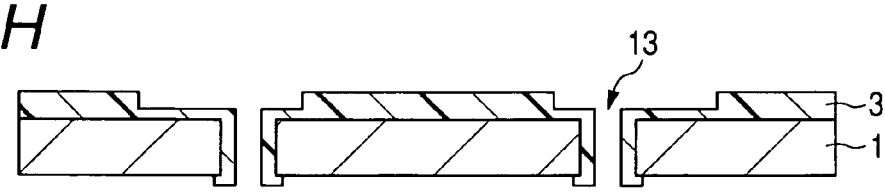

After the solidification of the insulating resin layer 3 is recognized, the nano metal mold 4 is separated from the silicon wafer 1. As shown in FIG. 4H, the silicon wafer 1 is obtained in which the indented structure pattern of the nano metal mold 4 is transferred to the insulating resin layer 3, in other words, the silicon wafer 1 is obtained in which the preliminary wiring pattern is formed on the insulating resin layer 3. An opening 13 of the preliminary wiring pattern can function as a space for forming the through wiring.

Figure 4I:
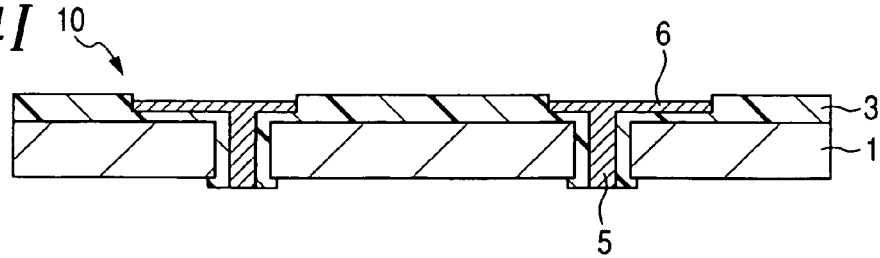

After the preliminary wiring pattern is formed as described above, a wiring is formed by a screen printing process of copper paste. As shown in FIG. 4I, an interposer 10 having a through wiring 5 made of copper and an upper wiring 6 made of copper through the interlayer insulating film 3 is obtained. In this example, the screen printing process is used to form the wiring. However, an ink jet printing process is also recommended to use in place of the screen printing process. Further, a plating method that is usually ordinarily employed may be used to form the wiring as required.

Example 2

In this example, the production of the interposer for the semiconductor device shown in FIG. 2 is described with reference to FIGS. 5A to 5K.

Figure 5A:
FIGS. 5A to 5K are sectional views sequentially showing a method for producing the interposer shown in FIG. 2.

Firstly, as shown in FIG. 5A, a silicon wafer having a prescribed size (in this example, thickness of 50 µm) is prepared.

Figure 5B:

Then, to form a first interlayer insulating film having a first preliminary wiring pattern in a process of a post-stage, the process shifts to a first imprint process. Firstly, as shown in FIG. 5B, for instance, a thermoplastic resin or a ultraviolet ray curing resin (in this example, polyimide resin) is applied to the upper surface of the silicon wafer 1 by a screen printing process to form a first insulating resin layer 21 with the thickness of 5 µm.

Figure 5C:
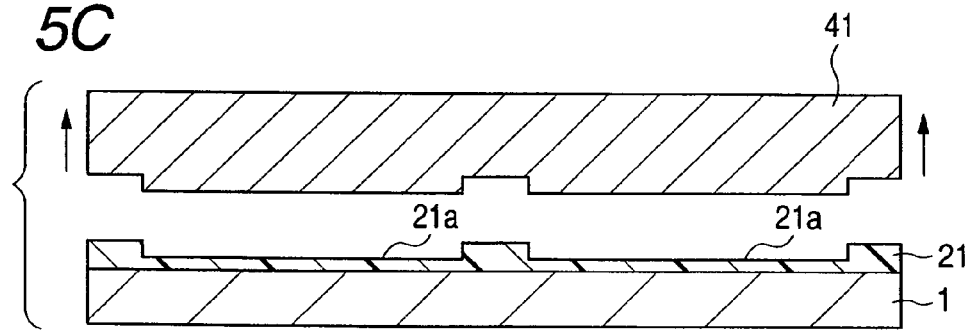

After the insulating resin layer 21 is formed as described above, a separately prepared first nano metal mold 41 is pressed to the first insulating resin layer 21. The first nano metal mold 41 is manufactured by finely processing, for instance, nickel, silicon, glass or the like. As shown in FIG. 5C, the first nano metal mold 41 has on its surface a fine indented structure pattern corresponding to a first wiring pattern. The first nano metal mold 41 is pressed to the first insulating resin layer 21 to harden the insulating resin layer 21 under this state. After the solidification of the insulating resin layer 21 is recognized, the first nano metal mold 41 is separated from the silicon wafer 1. As shown in FIG. 5C, the silicon wafer 1 is obtained in which the indented structure pattern of the first nano metal mold 41 is transferred to the insulating resin layer 21, in other words, the silicon wafer 1 is obtained in which the first preliminary wiring pattern 21a is formed on the insulating resin layer 21.

Figure 5D:
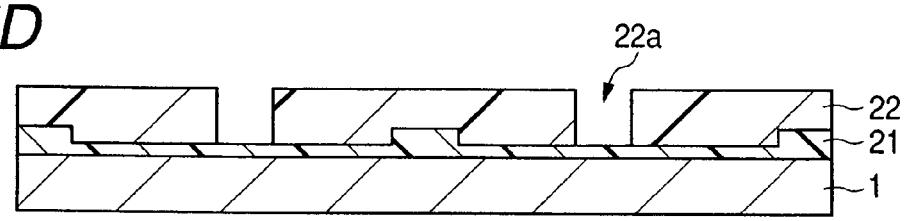

Then, as shown in FIG. 5D, a resist excellent in its etching resistance is applied to the surface of the silicon wafer 1. After the resist is hardened, the resist is patterned. As shown in the drawing, the silicon wafer 1 having a resist pattern 22 is obtained. Here, an opening 22a of the resist pattern 22 is provided to form a through wiring in a process of a post-stage. The diameter of the opening is arbitrarily changed within a range of, for instance, about 50 to 150 µm.

Figure 5E:
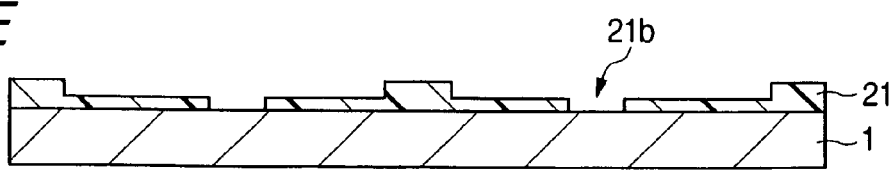

Then, under the presence of the resist pattern 22, the insulating resin layer 21 as a substrate is etched to selectively remove an exposed part. When the resist pattern 22 used as a mask is removed, the silicon wafer 1 having an opening 21b formed on the insulating resin layer 21 is obtained as shown in FIG. 5E.

Figure 5F:
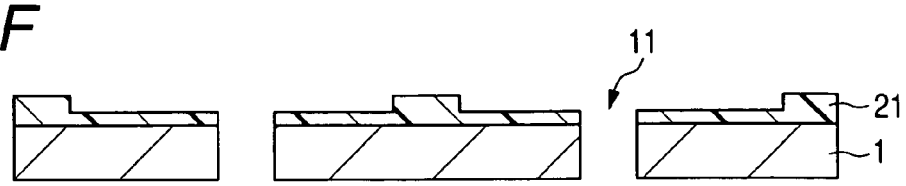

Subsequently, the silicon wafer 1 as a substrate is etched by using the insulating resin layer 21 as a mask to form a through hole 11 for forming the through wiring as shown in FIG. 5F. For an etching process, as described above, for instance, a plasma etching, a sputter etching and a reactive ion etching (RIE) may be employed.

Figure 5G:
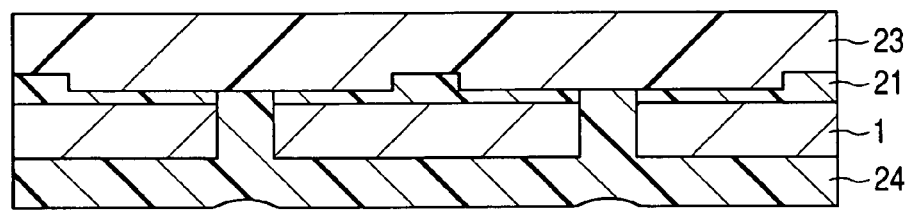
Figure 5H:
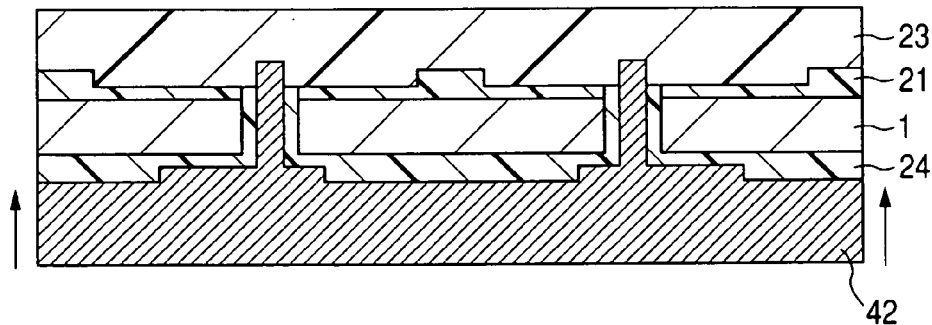

Then, to form a second interlayer insulating film having a second preliminary wiring pattern (including a through wiring part) in a process of a post-stage, the process shifts to a second imprint process. Firstly, as shown in FIG. 5G, a marketed masking tape 23 is stuck to the upper surface of the silicon wafer 1 to use the tape as a stopper of the insulating resin with which the through hole 11 of the silicon wafer 1 is filled. Then, for instance, a thermoplastic resin or a ultraviolet ray curing resin (in this example, the same polyimide resin as that used in the first insulating resin layer 21) is applied to the lower surface of the silicon wafer 1 by a screen printing process to form a second insulating resin layer 24 as shown in the drawing.

After the second insulating resin layer 24 is formed as described above, as shown in FIG. 5H, a separately prepared second nano metal mold 42 is pressed to the second insulating resin layer 24. The second nano metal mold 42 is manufactured by finely processing, for instance, nickel, silicon, glass or the like. As shown in the drawing, the second nano metal mold has on its surface a fine indented structure pattern corresponding to a second wiring pattern. The second nano metal mold 42 is pressed to the second insulating resin layer 24, and under this state, the insulating resin layer 24 is hardened.

Figure 5I:
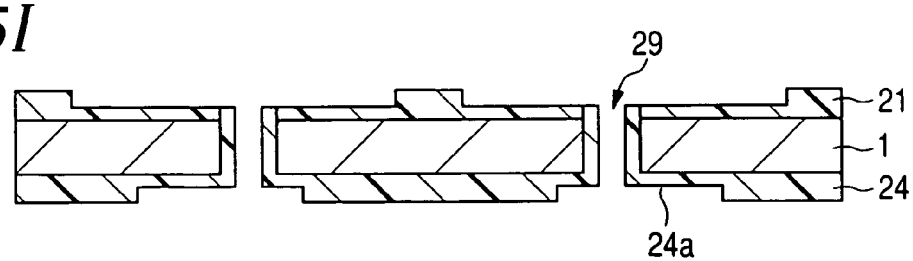

After the solidification of the second insulating resin layer 24 is recognized, the second nano metal mold 42 is separated from the silicon wafer 1. Thus, as shown in FIG. 5I, the silicon wafer 1 is obtained in which the indented structure pattern of the second nano metal mold 42 is transferred to the second insulating resin layer 24, in other words, the silicon wafer 1 is obtained in which the second preliminary wiring pattern 24a is formed on the second insulating resin layer 24. The second preliminary wiring pattern 24a is extended to the inner wall of a second through hole 29 for forming the through wiring.

Figure 5J:
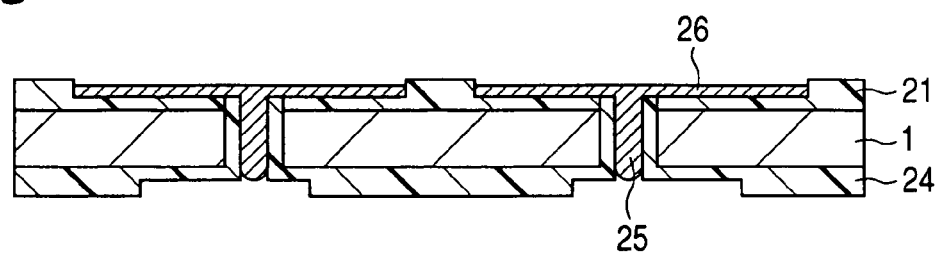
Figure 5K:
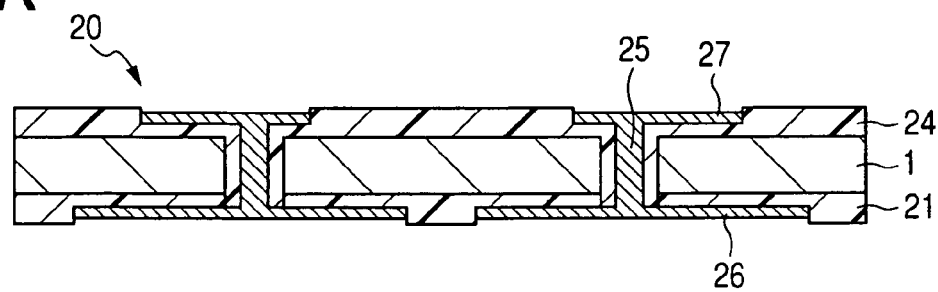

After the preliminary wiring patterns are formed on both the surfaces of the silicon wafer as described above, a wiring is formed by a screen printing process of copper paste. In this example, as shown in FIGS. 5J and 5K, the wiring is formed on each surface of the silicon wafer 1. As shown in FIG. 5K, the interposer 20 is obtained in which an upper wiring 26 and a lower wiring 27 made of copper are respectively formed through the interlayer insulating films 21 and 24, and the through wiring 25 made of copper through which these wiring are conducted to each other. In this example, the screen printing process is used to form the wiring. However, an ink jet printing process is also recommended to use in place of the screen printing process. Further, a plating method that is usually ordinarily employed may be used to form the wiring as required.

Further, though not shown in the drawings, a series of working processes shown in FIGS. 5B to 5K are repeated so that the interposer having the multi-layer wiring as shown in FIG. 3 can be manufactured.

What is claimed is:

1. An interposer interposed between a wiring board and an electronic element mounted on the wiring board and used to form an electronic device, the interposer comprising:

a flat plate shaped substrate made of an inorganic material;

a through wiring including conductors embedded in one or more through holes passing through the substrate; and an upper wiring and/or a lower wiring that are respectively formed in predetermined patterns on the surfaces of the substrate and electrically conducted through the through wiring, wherein the through wiring, the upper wiring and the lower wiring are respectively formed on preliminary wiring patterns that are additionally simultaneously or sequentially formed on layers made of an insulating material applied for at least wiring forming parts of the substrate, and respectively parts of a metal mold used for forming the preliminary wiring patterns, or layers made of a wiring material applied by a printing operation, a plating operation or a deposition on the preliminary wiring patterns formed on the layers of the insulating material by transferring a fine structure pattern of the metal mold, wherein the insulating material layer is provided on an upper surface of the substrate, a bottom surface of the substrate, and on inner parts at an inside portion of a through hole, and the preliminary wiring patterns are formed on inner parts of an insulating layer on inner parts of the through hole, and wherein the preliminary wiring pattern is an indented structure pattern corresponding to a wiring pattern formed on the insulating material.

2. The interposer according to claim 1, wherein
the preliminary wiring pattern is formed by a nano imprint technique that a nano metal mold having on a surface thereof a fine indented structure pattern corresponding to a wiring pattern is pressed to the layer of the insulating material to transfer the indented structure pattern on the layer of the insulating material.

3. The interposer according to claim 1, wherein
the through wiring, the upper wiring and/or the lower wiring are formed by a screen printing or an ink jet printing of the wiring material or a combination thereof.

4. The interposer according to claim 1, wherein
the substrate is made of silicon.

5. The interposer according to claim 1, having a multi-layer structure that a plurality of wiring layers are laminated on the surface of the substrate through insulating layers.

6. An electronic device having at least one electronic element, wherein
the electronic element is mounted on an upper part of the wiring board through the interposer according to claim 1.

* * * * *